United States Patent
Park et al.

(10) Patent No.: US 9,240,364 B2
(45) Date of Patent: Jan. 19, 2016

(54) ADHESIVE FILM FOR HEAT DISSIPATION, SEMICONDUCTOR DEVICE INCLUDING THE SAME, AND METHOD OF FABRICATING THE SEMICONDUCTOR DEVICE

(71) Applicants: Baek Soung Park, Uiwang-si (KR); Jae Won Choi, Uiwang-si (KR); In Hwan Kim, Uiwang-si (KR); Gyu Seok Song, Uiwang-si (KR); Su Mi Lim, Uiwang-si (KR)

(72) Inventors: Baek Soung Park, Uiwang-si (KR); Jae Won Choi, Uiwang-si (KR); In Hwan Kim, Uiwang-si (KR); Gyu Seok Song, Uiwang-si (KR); Su Mi Lim, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 14/202,006

(22) Filed: Mar. 10, 2014

(65) Prior Publication Data

US 2014/0353848 A1 Dec. 4, 2014

(30) Foreign Application Priority Data

May 30, 2013 (KR) .................. 10-2013-0061739

(51) Int. Cl.
*H01L 23/48* (2006.01)
*H01L 23/373* (2006.01)
*H01L 23/36* (2006.01)
*H01L 21/48* (2006.01)
*H01L 25/065* (2006.01)
*H01L 23/31* (2006.01)

(52) U.S. Cl.
CPC ............ *H01L 23/3737* (2013.01); *H01L 23/36* (2013.01); *H01L 21/4882* (2013.01); *H01L 23/3121* (2013.01); *H01L 25/0657* (2013.01); *H01L 2224/16145* (2013.01); *H01L 2224/45139* (2013.01); *H01L 2224/48091* (2013.01); *H01L 2224/73204* (2013.01); *H01L 2224/73265* (2013.01); *Y10T 428/2848* (2015.01)

(58) Field of Classification Search
CPC . H01L 23/36; H01L 23/3737; H01L 21/4882; H01L 23/3121; H01L 25/0657; H01L 2224/48091; H01L 2224/73204; H01L 2224/73265; H01L 2224/16145; H01L 2924/00014; Y10T 428/2848
See application file for complete search history.

(56) References Cited

U.S. PATENT DOCUMENTS

| | | | | |
|---|---|---|---|---|
| 6,251,707 | B1 * | 6/2001 | Bernier et al. | 438/122 |
| 2003/0123229 | A1 * | 7/2003 | Egitto et al. | 361/709 |
| 2004/0102023 | A1 * | 5/2004 | Morozumi et al. | 438/460 |
| 2011/0233756 | A1 * | 9/2011 | Khandekar et al. | 257/712 |
| 2011/0316144 | A1 * | 12/2011 | Yoo et al. | 257/718 |
| 2012/0261064 | A1 * | 10/2012 | Boday et al. | 156/247 |
| 2012/0280381 | A1 * | 11/2012 | Beyne et al. | 257/680 |

FOREIGN PATENT DOCUMENTS

KR 10-2012-0061610 A 6/2012

* cited by examiner

*Primary Examiner* — A. Sefer
(74) *Attorney, Agent, or Firm* — Lee & Morse, P.C.

(57) ABSTRACT

A heat dissipation adhesive film, a semiconductor device including the same, and a method of fabricating the semiconductor device, the heat dissipation adhesive film being placeable between a protective layer encasing a semiconductor element therein and a heat dissipation metal layer on the protective layer to bond the protective layer to the heat dissipation metal layer, wherein an adhesive strength between the heat dissipation adhesive film and the protective layer and an adhesive strength between the heat dissipation adhesive film and the heat dissipation metal layer are each about 3 kgf/25 $mm^2$ or greater.

20 Claims, 2 Drawing Sheets

ADHESIVE FILM FOR HEAT DISSIPATION, SEMICONDUCTOR DEVICE INCLUDING THE SAME, AND METHOD OF FABRICATING THE SEMICONDUCTOR DEVICE

CROSS-REFERENCE TO RELATED APPLICATION

Korean Patent Application No. 10-2013-0061739, filed on May 30, 2013, in the Korean Intellectual Property Office, and entitled: "ADHESIVE FILM FOR HEAT DISSIPATION, SEMICONDUCTOR DEVICE INCLUDING THE SAME, AND METHOD OF FABRICATING THE SEMICONDUCTOR DEVICE," is incorporated by reference herein in its entirety.

BACKGROUND

1. Field

Embodiments relate to a heat dissipation adhesive film, a semiconductor device including the same, and a method of fabricating the semiconductor device.

2. Description of the Related Art

Coating with an epoxy resin, silicone resin, or the like may be performed for the purpose of insulation, moisture proofing or waterproofing, or vibration absorption for electronic components. In addition, a heat splitter or a heat sink may be provided to a semiconductor package to protect IC chips and other elements from heat generated in the semiconductor package.

SUMMARY

Embodiments are directed to a heat dissipation adhesive film, a semiconductor device including the same, and a method of fabricating the semiconductor device.

The embodiments may be realized by providing a heat dissipation adhesive film comprising thermally conductive particles, the heat dissipation adhesive film being placeable between a protective layer encasing a semiconductor element therein and a heat dissipation metal layer on the protective layer to bond the protective layer to the heat dissipation metal layer, wherein an adhesive strength between the heat dissipation adhesive film and the protective layer and an adhesive strength between the heat dissipation adhesive film and the heat dissipation metal layer are each about 3 kgf/25 mm$^2$ or greater.

The thermally conductive particles may include at least one selected from the group of alumina, aluminum nitride, aluminum oxide, boron nitride, aluminum hydroxide, magnesium hydroxide, calcium carbide, magnesium carbide, calcium silicate, magnesium silicate, calcium oxide, magnesium oxide, titanium dioxide, and iron oxide particles.

The heat dissipation adhesive film may further include a heat dissipation adhesive layer and a base film.

The thermally conductive particles may be present in an amount of about 20 wt % to about 85 wt %, based on a total weight of the heat dissipation adhesive layer.

The thermally conductive particles may be present in an amount of about 30 wt % to about 80 wt %, based on the total weight of the heat dissipation adhesive layer.

The heat dissipation adhesive layer may further include an epoxy resin.

The heat dissipation adhesive film may have a thermal conductivity of 1 W/mK or greater.

The embodiments may be realized by providing a semiconductor device including a semiconductor element; a protective layer encasing the semiconductor element therein; a heat dissipation adhesive layer on the protective layer; and a heat dissipation metal layer on the heat dissipation adhesive layer, wherein an adhesive strength between the heat dissipation adhesive layer and the protective layer and an adhesive strength between the heat dissipation adhesive layer and the heat dissipation metal layer are each about 3 kgf/25 mm$^2$ or more.

The semiconductor element may include an exposed surface that is not encased by the protective layer, and the heat dissipation adhesive layer may contact both the exposed surface and the protective layer.

The adhesive strength between the heat dissipation adhesive layer and the semiconductor element may be about 3 kgf/25 mm$^2$ or greater.

The heat dissipation adhesive layer may include an epoxy resin and thermally conductive particles.

The thermally conductive particles may be present in an amount of about 20 wt % to about 85 wt %, based on a total weight of the heat dissipation adhesive layer.

The heat dissipation adhesive layer may have a thermal conductivity of about 1 W/mK or greater.

The embodiments may be realized by providing a method of fabricating a semiconductor device, the method including forming a protective layer encasing a semiconductor element therein, forming a heat dissipation adhesive layer and a heat dissipation metal layer on the protective layer, the heat dissipation adhesive layer having a thermal conductivity of about 1 W/mK or greater.

The heat dissipation adhesive layer may include an epoxy resin and thermally conductive particles.

The thermally conductive particles may be present in an amount of about 20 wt % to about 85 wt %, based on a total weight of the heat dissipation adhesive layer.

An adhesive strength between the heat dissipation adhesive layer and the protective layer and an adhesive strength between the heat dissipation adhesive layer and the heat dissipation metal layer may each be about 3 kgf/25 mm$^2$ or greater.

In forming of the protective layer, the semiconductor element may include an exposed surface that is not encased by the protective layer, and the heat dissipation adhesive layer may contact both the exposed surface and the protective layer.

An adhesive strength between the heat dissipation adhesive layer and the semiconductor element may be about 3 kgf/25 mm$^2$ or greater.

The forming the heat dissipation adhesive layer and the heat dissipation metal layer may include forming a heat dissipation adhesive film on the protective layer, the heat dissipation adhesive film including a heat dissipation metal layer and a heat dissipation adhesive layer having a thermal conductivity of 1 W/mK or more.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
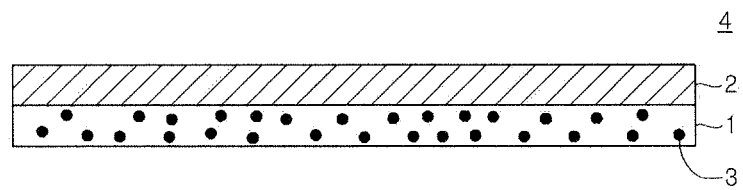
FIG. 1 illustrates a sectional view of a heat dissipation adhesive film in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In accordance with an embodiment, a heat dissipation adhesive film may include a heat dissipation adhesive layer and a base film on one or both surfaces of the heat dissipation adhesive layer. The heat dissipation adhesive layer may include, e.g., an epoxy resin and thermally conductive particles. In an implementation, the heat dissipation adhesive layer may further include, e.g., a polymer resin, a curing agent, and/or a curing accelerator. In an implementation, the heat dissipation adhesive layer may further include, e.g., a silane coupling agent. The heat dissipation adhesive film according to an embodiment may be disposed such that the heat dissipation adhesive layer is placed or is placeable between a protective layer encasing a semiconductor element therein and a heat dissipation metal layer to bond the protective layer to the heat dissipation metal layer.

In accordance with another embodiment, a heat dissipation adhesive film may include thermally conductive particles and may be placed or placeable between a protective layer encasing a semiconductor element therein and a heat dissipation metal layer on the protective layer to bond the protective layer to the heat dissipation metal layer. An adhesive strength between the protective layer and the heat dissipation metal layer may be about 3 kgf/25 mm$^2$ or greater.

The semiconductor element may be completely encased by the protective layer or may have an exposed surface that is not encased by the protective layer. Thus, the heat dissipation adhesive layer may adjoin or contact both the exposed surface and the protective layer.

According to an embodiment, the adhesive strength between the heat dissipation adhesive layer and the protective layer and between the heat dissipation adhesive layer and the heat dissipation metal layer may each be about 3 kgf/25 mm$^2$ or greater. In an implementation, when the semiconductor element has the exposed surface that is not encased by the protective layer, adhesive strength between the heat dissipation adhesive layer and the exposed surface of the semiconductor element may be about 3 kgf/25 mm$^2$ or greater. For example, the adhesive strength between the heat dissipation adhesive layer and the protective layer may be about 3.5 kgf/25 mm$^2$ or greater, the adhesive strength between the heat dissipation adhesive layer and the heat dissipation metal layer may be about 4.0 kgf/25 mm$^2$ or greater, and/or the adhesive strength between the heat dissipation adhesive layer and the semiconductor element may be about 4.5 kgf/25 mm$^2$ or greater. In an implementation, the adhesive strength between the heat dissipation adhesive layer and the protective layer may be about 4 kgf/25 mm$^2$ or greater, the adhesive strength between the heat dissipation adhesive layer and the heat dissipation metal layer may be about 4.5 kgf/25 mm$^2$ or greater, and/or the adhesive strength between the heat dissipation adhesive layer and the semiconductor element may be about 5.0 kgf/25 mm$^2$ or greater.

Referring to FIG. 1, a heat dissipation adhesive film 4 according to an embodiment may include a heat dissipation adhesive layer 1 (which includes, e.g., a polymer resin, an epoxy resin, a curing agent, a curing accelerator, and thermally conductive particles 3) and a base film 2.

The thermally conductive particles 3 may include suitable particles that are capable of effectively transferring heat from a semiconductor element or from a protective layer to a heat dissipation metal layer. For example, the thermally conductive particles may have a thermal conductivity of 10 W/mK or more. In an implementation, the thermally conductive particles may include at least one selected from the group of alumina particles, aluminum nitride particles, aluminum oxide particles, boron nitride particles, aluminum hydroxide particles, magnesium hydroxide particles, calcium carbide particles, magnesium carbide particles, calcium silicate particles, magnesium silicate particles, calcium oxide particles, magnesium oxide particles, titanium dioxide particles, and iron oxide particles. In an implementation, the thermally conductive particles may include at least one selected from among alumina particles, aluminum nitride particles, boron nitride particles, and mixtures thereof. In an implementation, the thermally conductive particles may include alumina particles, aluminum nitride particles, or boron nitride particles. The thermally conductive particles 3 may have, e.g., a spherical shape. In an implementation, the thermally conductive particles 3 may have, e.g., an amorphous shape, a flake shape, a needle shape, a chain shape, or the like.

The thermally conductive particles may be present in an amount of about 20% by weight (wt %) to about 85 wt %, based on a total weight of the heat dissipation adhesive layer in turns of solid content. In an implementation, the thermally conductive particles may be present in an amount of about 30 wt % to about 80 wt %. Within this range, the thermally conductive particles in the heat dissipation adhesive layer may help prevent a semiconductor device from shutting down due to excessive heat by rapidly transferring heat from a semiconductor element to the heat dissipation metal layer.

The heat dissipation adhesive film according to an embodiment may have a thermal conductivity of about 1 W/mK or more.

Figure 2:
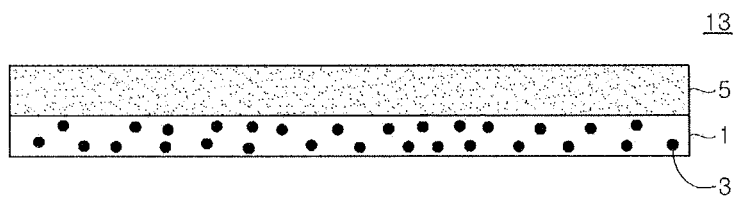
FIG. 2 illustrates a sectional view of a heat dissipation adhesive film in accordance with another embodiment.

Another embodiment provides a heat dissipation adhesive film that includes a heat dissipation adhesive layer and a heat dissipation metal layer. Referring to FIG. 2, in this embodiment, a heat dissipation adhesive film 13 may include a heat dissipation adhesive layer 1 and a heat dissipation metal layer 5. In an implementation, the heat dissipation adhesive film 13 may further include a base film (not shown) attached to the heat dissipation adhesive layer 1.

The heat dissipation adhesive layer may have the same composition as that of the heat dissipation adhesive layer according to an embodiment. The heat dissipation metal layer may include a suitable component that is capable of transferring heat to help prevent the semiconductor device from shutting down due to excessive heat. For example, the heat dissipation metal layer may include aluminum or copper.

Figure 3:
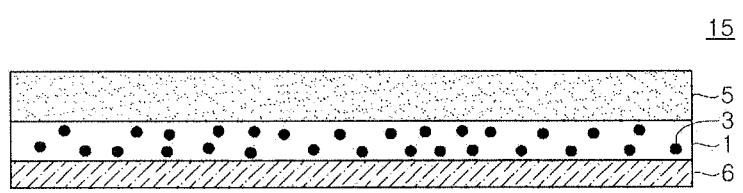
FIG. 3 illustrates a sectional view of a heat dissipation adhesive film in accordance with another embodiment.

In this embodiment, the heat dissipation adhesive film may further include a UV curable pressure-sensitive adhesive layer. Referring to FIG. 3, a heat dissipation adhesive film 15 may have a stack structure in which an UV curable pressure-sensitive adhesive layer 6, a heat dissipation adhesive layer 1, and a heat dissipation metal layer 5 are sequentially stacked. The UV curable pressure-sensitive adhesive layer 6 may hold the heat dissipation metal layer 5 upon cutting of the heat dissipation metal layer 5, and may be cured by UV irradiation after cutting the heat dissipation metal layer 5 such that the UV curable pressure-sensitive adhesive layer 6 may be easily separated from the heat dissipation adhesive layer 1.

Another embodiment may provide a semiconductor device (which includes a protective layer encasing a semiconductor element therein); a heat dissipation adhesive layer on the protective layer; and a heat dissipation metal layer on the heat dissipation adhesive layer. An adhesive strength between the heat dissipation adhesive layer and the protective layer and between the heat dissipation adhesive layer and the heat dissipation metal layer may each be about 3 kgf/25 mm² or greater.

As used herein, the term 'semiconductor element' means a solid element using electrical conduction of semiconductor materials, and may include, e.g., a drive IC or a silicon chip mounted on a tape carrier package or a chip-on-film placed on an edge of a display panel, such as a liquid crystal display (LCD), plasma display panel (PDP), and organic light emitting diode (OLED), light-emitting diode (LED), or the like. In an implementation, the semiconductor element may refer to an integrated circuit including a plurality of transistors, resistors, capacitors, and the like on a silicon substrate, and may include a semiconductor chip.

As used herein, the term 'protective layer' is an insulating composite material protecting the semiconductor element from an exterior environment, e.g., moisture, impact, heat, charges, or the like. For example, the protective layer may be formed of an epoxy molding compound (EMC).

As used herein, the term 'heat dissipation metal layer' refers to a component that receives heat from the semiconductor element and uniformly dissipates the heat over the heat dissipation metal layer to facilitate heat dissipation to air. For example, the heat dissipation metal layer may include a heat sink. In an implementation, the heat dissipation metal layer may be formed of a material having high thermal conductivity, e.g., aluminum or copper.

Figure 4:
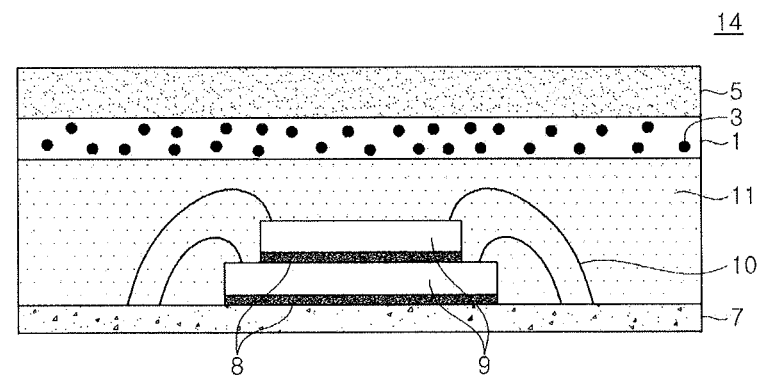
FIG. 4 illustrates a sectional view of a semiconductor device in accordance with an embodiment.

Referring to FIG. 4, a semiconductor device 14 according to an embodiment may include a semiconductor element 9 (bonded to a wiring substrate 7 by a semiconductor bonding film 8), a protective layer 11, a heat dissipation adhesive layer 1 on the protective layer 11, and a heat dissipation metal layer 5 on the heat dissipation adhesive layer 1. The semiconductor element 9 and the wiring substrate 7 may be electrically connected to each other by wires 10. The protective layer 11 (protecting the semiconductor element 9) may be formed of, e.g., EMC (Epoxy Molding Compound), and the heat dissipation metal layer 5 (dissipating heat from the semiconductor element 9) may be attached to the protective layer 11 via the heat dissipation adhesive layer 1. In this embodiment, the heat dissipation adhesive layer 1 may adjoin or contact the heat dissipation metal layer 5 and the protective layer 11. The adhesive strength between the heat dissipation adhesive layer 1 and the heat dissipation metal layer 5 and/or adhesive strength between the heat dissipation adhesive layer 1 and the protective layer 11 may be about 3 kgf/25 mm² or greater.

Figure 5:
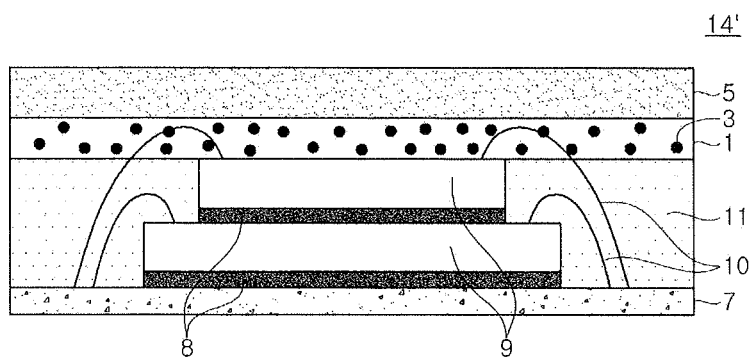
FIG. 5 illustrates a sectional view of a semiconductor device in accordance with another embodiment.

Referring to FIG. 5, a semiconductor device 14' according to another embodiment may include a semiconductor element 9 directly exposed to the heat dissipation adhesive layer 1. In this embodiment, the semiconductor element may have an exposed surface that is not encased by the protective layer, and the heat dissipation adhesive layer may adjoin or contact both the exposed surface of the semiconductor element and the protective layer. In this case, the adhesive strength between the heat dissipation adhesive layer 1 and the heat dissipation metal layer 5 and/or the adhesive strength between the heat dissipation adhesive layer 1 and the protective layer 11 may be about 3 kgf/25 mm² or greater, and the adhesive strength between the heat dissipation adhesive layer 1 and the semiconductor element 9 may be about 3 kgf/25 mm² or greater.

Figure 6:
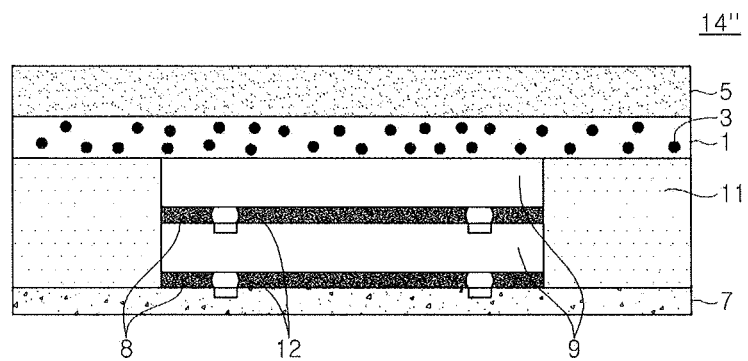
FIG. 6 illustrates a sectional view of a semiconductor device in accordance with another embodiment.

Referring to FIG. 6, the semiconductor device may include a connection member 12 instead of the wires 10 (see FIG. 5). The connection member 12 may be a solder ball or a conductive bump. In an implementation, the connection member 12 may be, e.g., a conductive bump, as shown in FIG. 6. The connection member 12 may be formed of, e.g., gold, silver, nickel, copper, tin, or alloys thereof. In an implementation, the connection member 12 may be formed of, e.g., alloys of copper-nickel-lead (Cu—Ni—Pb), copper-nickel-gold (Cu—Ni—Au), copper-nickel, nickel-gold, nickel-silver, or the like. In this case, the adhesive strength between the heat dissipation adhesive layer 1 and the heat dissipation metal layer 5, and/or the adhesive strength between the heat dissipation adhesive layer 1 and the protective layer 11 may be about 3 kgf/25 mm² or greater, and the adhesive strength between the heat dissipation adhesive layer 1 and the semiconductor element 9 may be about 3 kgf/25 mm² or greater.

The heat dissipation adhesive layer 1 according to an embodiment may have a uniform thickness, and thus may not only help maintain uniform heat dissipation efficiency over the heat dissipation adhesive film, but may also help secure a uniform thickness of the semiconductor package. In addition, as compared with a liquid type adhesive, the heat dissipation adhesive film may help reduce void generation and may have improved adhesion, thereby improving moisture absorption reliability.

Another embodiment relates to a method of fabricating a semiconductor device. The method may include, e.g., forming a protective layer encasing a semiconductor element; and forming a heat dissipation adhesive layer (having a thermal conductivity of 1 W/mK or more and a heat dissipation metal layer) on the protective layer. Formation of the heat dissipation adhesive layer and the heat dissipation metal layer may include forming a heat dissipation adhesive film (which includes the heat dissipation adhesive layer having a thermal conductivity of 1 W/mK or more and the heat dissipation metal layer) on the protective layer.

Another embodiment relates to a method of fabricating a semiconductor device, including forming a protective layer encasing a semiconductor element; forming a heat dissipation adhesive layer having a thermal conductivity of 1 W/mK or more on the protective layer; and forming a heat dissipation metal layer on the heat dissipation adhesive layer.

In this embodiment, descriptions of the semiconductor element, the protective layer, the heat dissipation adhesive layer and the heat dissipation metal layer are the same as those above.

Next, each of the components of the heat dissipation adhesive film, e.g., a polymer resin, epoxy resin, curing agent, curing accelerator, and thermally conductive particles, will be described in more detail.

Polymer Resin

The polymer resin may include, e.g., a (meth)acryl resin, a polyimide resin, a polystyrene resin, a polyethylene resin, a polyester resin, a polyamide resin, a butadiene rubber, an acryl rubber, a urethane resin, a polyphenylene ether resin, a polyether imide resin, a phenoxy resin, a polycarbonate resin, a polyphenylene ether resin, a modified polyphenylene ether resin, an epoxy group-containing (meth)acryl copolymer containing glycidyl (meth)acrylate, or mixtures thereof. For example, the polymer resin may be a (meth)acryl resin (acrylic polymer resin).

The (meth)acryl polymer resin may include, e.g., a commercially available product. The acryl polymer resin may be classified according to epoxy equivalent weight, glass transition temperature, and weight average molecular weight thereof. An example of a (meth)acryl polymer resin having an epoxy equivalent weight of greater than 10,000 may include SG-80H (Nagase Chemtex), and an example of a (meth)acryl polymer resin having an epoxy equivalent weight of 10,000 or less may include SG-P3, SG-800H, or the like. The (meth)acryl polymer resin may include, e.g., an acryl resin having a weight average molecular weight of 10,000 to 1,000,000, which may be used alone or as a mixture with other polymer resins.

In addition, the (meth)acryl polymer resin may be prepared through polymerization of a (meth)acryl monomer as a main monomer by adding a functional (meth)acryl monomer to the (meth)acryl monomer. The (meth)acryl polymer resin may allow for easy adjustment of the glass transition temperature or the weight average molecular weight, e.g., may allow for easy introduction of a functional group into a side chain through suitable selection of monomers to be polymerized therewith.

The (meth)acryl monomer may impart adhesion to the adhesive film, and may include, e.g., at least one selected from the group of 2-ethylhexyl methacrylate, isooctyl acrylate, 2-ethylhexyl acrylate, ethyl acrylate, n-butyl acrylate, isobutyl acrylate, and octadecyl methacrylate.

In an implementation, the hydroxyl monomer may include, e.g., at least one selected from the group of 2-hydroxyethyl methacrylate, 2-hydroxyethyl acrylate, 3-hydroxypropyl methacrylate, 3-hydroxypropyl acrylate, hydroxypropyl (meth)acrylate, 4-hydroxybutyl acrylate, N-(hydroxymethyl) acrylate, 3-chloro-2-hydroxypropyl methacrylate, and vinyl caprolactam.

An acrylic polymer resin not containing a hydroxyl group may include, e.g., an epoxy group containing acrylic polymer resins, in which the epoxy group containing monomer includes glycidyl methacrylate, glycidyl acrylate, or the like.

In an implementation, the polymer resin may have a glass transition temperature (Tg) of, e.g., from about −10° C. to about 20° C., to help maintain suitable viscosity after curing.

The polymer resin may be present in an amount of about 5 wt % to about 35 wt %, based on a total weight of the heat dissipation adhesive layer in terms of solid content. In an implementation, the acrylic polymer resin may be present in an amount of about 10 wt % to about 35 wt %, based on the total weight of the heat dissipation adhesive layer in terms of solid content. Within this range, the adhesive film may help improve adhesion with respect not only to the semiconductor element, but also to the protective layer, the heat dissipation metal layer, or the like.

Thermally Conductive Particles

The thermally conductive particles may include suitable particles that are able to effectively transfer heat from the semiconductor element or the protective layer to the heat dissipation metal layer. In an implementation, the thermally conductive particles may have a thermal conductivity of about 10 W/mK or more, e.g., about 20 W/mK or more. For example, the thermally conductive particles may include at least one selected from the group of alumina, aluminum nitride, aluminum oxide, boron nitride, aluminum hydroxide, magnesium hydroxide, calcium carbide, magnesium carbide, calcium silicate, magnesium silicate, calcium oxide, magnesium oxide, titanium dioxide, and iron oxide particles. In an implementation, the thermally conductive particles may include, e.g., alumina particles, aluminum nitride particles, or boron nitride particles.

The thermally conductive particles may be present in an amount of about 20 wt % to about 85 wt %, based on the total weight of the heat dissipation adhesive layer in terms of solid content. In an implementation, the thermally conductive particles may be present in an amount of about 30 wt % to about 80 wt %. Within this range, the thermally conductive particles in the heat dissipation adhesive layer may rapidly transfer heat from the semiconductor element to the heat dissipation metal layer, thereby preventing the semiconductor device from shutting down due to excessive heat.

Epoxy Resin

The epoxy resin may include a suitable resin that is capable of being cured and that exhibits a bonding function. The epoxy resin may have, e.g., a monofunctional group or polyfunctional group.

The epoxy resin may include at least one selected from the group of bisphenol epoxy, phenol novolac epoxy, cresol novolac epoxy, polyfunctional epoxy, amine epoxy, heterocyclic epoxy, substituted epoxy, naphthol epoxy resins, and derivatives thereof. In an implementation, the epoxy resin may include, e.g., a cresol novolac epoxy resin.

Commercially available solid epoxy resins may include bisphenol epoxy resins such as YD-017H, YD-020, YD020-L, YD-014, YD-014ER, YD-013K, YD-019K, YD-019, YD-017R, YD-017, YD-012, YD-011H, YD-011S, YD-011, YD-028, YDF-170, YDF-2004, YDF-2001 (Kukdo Chemical Co., Ltd.), etc. Examples of phenol novolac epoxy resins may include CHEPIKOTE 152 and EPIKOTE 154 (Yuka Shell Epoxy Co., Ltd.); EPPN-201 (Nippon Kayaku Co., Ltd.); DN-483 (Dow Chemical Company); YDPN-641, YDPN-638A80, YDPN-638, YDPN-637, YDPN-644, YDPN-631 (Kukdo Chemical Co., Ltd.), etc. Examples of o-cresol novolac epoxy resins may include: YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, YDCN-500-90PA75 (Kukdo Chemical Co., Ltd.); EOCN-102S, EOCN-103S, EOCN-104S, EOCN-1012, EOCN-1025, EOCN-1027 (Nippon Kayaku Co., Ltd.); YDCN-701, YDCN-702, YDCN-703, YDCN-704 (Tohto Kagaku Co., Ltd.); Epiclon N-665-EXP (Dainippon Ink and Chemicals, Inc.), etc. Examples of bisphenol novolac epoxy resins may include KBPN-110, KBPN-120, KBPN-115 (Kukdo Chemical Co., Ltd.), etc. Examples of polyfunctional epoxy resins may include Epon 1031 S (Yuka Shell Epoxy Co., Ltd.); Araldite 0163 (Ciba Specialty Chemicals Co., Ltd.); Detachol EX-611, Detachol EX-614, Detachol EX-614B, Detachol EX-622, Detachol EX-512, Detachol EX-521, Detachol EX-421, Detachol EX-411, Detachol EX-321 (NAGA Celsius Temperature Kasei Co., Ltd.); EP-5200R, KD-1012, EP-5100R, KD-1011, KDT-4400A70, KDT-4400, YH-434L, YH-434, YH-300 (Kukdo Chemical Co., Ltd.), etc. Examples of amine epoxy resins may include EPIKOTE 604 (Yuka Shell Epoxy Co., Ltd.); YH-434 (Tohto Kagaku Co., Ltd.); TETRAD-X and TETRAD-C (Mitsubishi Gas Chemical Company Inc.); ELM-120 (Sumitomo Chemical Industry Co., Ltd.), etc. Examples of heterocyclic epoxy resins may include PT-810 (Ciba Specialty Chemicals). Examples of substituted epoxy resins may include: ERL-4234, ERL-4299, ERL-4221, ERL-4206 (UCC Co., Ltd.), etc. Examples of naphthol epoxy resins include: Epiclon HP-4032, Epiclon HP-4032D, Epiclon HP-4700, and Epiclon HP-4701 (Dainippon Ink and Chemicals, Inc.). These epoxy resins may be used alone or as mixtures.

The epoxy resin may be present in an amount of about 1 wt % to about 35 wt %, based on the total weight of the heat dissipation adhesive layer in terms of solid content. Within this range, the adhesive film may exhibit excellent reliability and tensile strength.

Curing Agent

In an implementation, the curing agent may include, e.g., at least one of phenolic curing agents and amine curing agents. For example, the curing agent may be a phenolic epoxy curing agent. The phenolic epoxy curing agent may include a suitable phenolic epoxy curing agent that is capable of adjusting curing rate, e.g., xylok curing agents, bisphenol resins, which contain two or more phenolic hydroxyl groups in a single molecule and exhibits excellent electrolytic corrosion upon moisture absorption, such as bisphenol A, bisphenol F, bisphenol S, and the like; phenol novolac resins; bisphenol A novolac resins; phenolic resins, such as cresol novolac, biphenyl resins, and the like.

An example of commercially available phenol novolac resins may include DL-92 (Meiwa Plastic Industries Co., Ltd.); examples of commercially available simple phenolic curing agents may include H-1, H-4, HF-1M, HF-3M, HF-4M, HF-45, and the like (Meiwa Plastic Industries Co., Ltd.), examples of paraxylene phenolic curing agents may include MEH-78004S, MEH-7800SS, MEH-7800S, MEH-7800M, MEH-7800H, MEH-7800HH, MEH-78003H (Meiwa Plastic Industries Co., Ltd.), KPH-F3065 (Kolong Industries Co., Ltd.); examples of biphenyl curing agents may include MEH-7851SS, MEH-7851S, MEH7851M, MEH-7851H, MEH-78513H, MEH-78514H, (Meiwa Plastic Industries Co., Ltd.), and KPH-F4500 (Kolong Industries Co., Ltd.); and examples of triphenylmethyl curing agents may include MEH-7500, MEH-75003S, MEH-7500SS, MEH-7500S, MEH-7500H (Meiwa Plastic Industries Co., Ltd.), etc. These may be used alone or as mixtures thereof.

The phenolic epoxy curing agent may be present in an amount of about 1 wt % to about 30 wt %, based on the total weight of the heat dissipation adhesive layer in terms of solid content. Within this range, the adhesive film may exhibit excellent reliability and tensile strength without deteriorating void removal.

Curing Accelerator

The curing accelerator may help reduce a curing time of the epoxy resin during a semiconductor process. The curing accelerator may include, e.g., at least one selected from the group of melamine, imidazole, and triphenylphosphine curing accelerators.

Examples of commercially available imidazole curing accelerators may include PN-23, PN-40 (Ajinomoto Fine Technology Co., Inc.), 2P4MZ, 2MA-OK, 2MAOK-PW, 2P4MHZ (Shikoku Chemicals Co.) as imidazole curing agents, TPP, TPP-K, TPP-MK (HOKKO Chemical Industry Co., Ltd.) as phosphine curing accelerators, etc. These may be used alone or as a mixture of two or more thereof.

The curing accelerator may be present in an amount of about 0.01 wt % to about 10 wt %, based on the total weight of the heat dissipation adhesive layer in terms of solid content. Within this range, the adhesive film may exhibit high heat resistance and maintenance stability through sufficient reaction of the epoxy resin.

The heat dissipation adhesive film according to an embodiment may further include a silane coupling agent. The silane coupling agent may function as an adhesion promoter to help enhance adhesion between the surface of an inorganic material and an organic material via chemical coupling therebetween.

Examples of the silane coupling agent may include: epoxy group-containing silane coupling agents, such as 2-(3,4-epoxycyclohexyl)-ethyltrimethoxysilane, 3-glycidoxytrimethoxysilane, and 3-glycidoxypropyltriethoxysilane; amine group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine and N-phenyl-3-aminopropyltrimethoxysilane; mercapto-containing silane coupling agents, such as 3-mercaptopropylmethyldimethoxysilane and 3-mercaptopropyltriethoxysilane; and isocyanate-containing silane coupling agents, such as 3-isocyanatepropyltriethoxysilane. These silane coupling agents may be used alone or as mixtures thereof.

The coupling agent may be present in an amount of about 0.01 wt % to about 5 wt %, e.g., about 0.5 wt % to about 5 wt %, based on the total weight of the heat dissipation adhesive layer in terms of solid content. Within this range, the adhesive film may secure high adhesion reliability.

Solvent

The heat dissipation adhesive film according to an embodiment may further include a solvent. The solvent may reduce the viscosity of a composition for the adhesive film, thereby facilitating formation of the adhesive film. Examples of solvents may include organic solvents such as toluene, xylene, propylene glycol monomethyl ether acetate, benzene, acetone, methylethylketone, tetrahydrofuran, dimethylformaldehyde, and cyclohexanone.

Another embodiment relates to a heat dissipation adhesive film prepared from the adhesive composition. There is no need for a special apparatus or equipment for forming an adhesive film for semiconductors using the adhesive composition according to an embodiment, and a suitable method may be used to manufacture the adhesive film. For example, the respective components may be dissolved in a solvent, such as cyclohexanone, and sufficiently kneaded using a bead-mill, followed by depositing the resulting material on a polyethylene terephthalate (PET) film subjected to release treatment, and drying in an oven at 100° C. for 10~30 minutes to prepare an adhesive film having a suitable thickness.

In an implementation, the heat dissipation adhesive film may include a base film, a heat dissipation adhesive layer, a UV curable pressure-sensitive adhesive layer, and a protective film, which are sequentially stacked in this order.

In another implementation, the heat dissipation adhesive film may include a protective film, a heat dissipation adhesive layer, a heat dissipation metal layer, and a base film. The heat dissipation adhesive film may further include a UV curable pressure-sensitive adhesive layer between the protective film and the heat dissipation adhesive layer.

The heat dissipation adhesive film may have a thickness of about 5 µm to about 200 µm, e.g., from about 10 µm to about 100 µm. Within this range, the heat dissipation adhesive film may exhibit sufficient adhesion while providing economic feasibility. In an implementation, the heat dissipation adhesive film may have a thickness of, e.g., about 15 µm to about 60 µm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1-4

Preparation of Heat Dissipation Adhesive Film

A solvent (cyclohexanone) was added to a binder resin, an epoxy resin, a phenolic curing agent, a curing accelerator, thermally conductive particles, and a silane coupling agent in a composition as listed in Table 1 such that the solid content in the solution was 40% by weight, followed by sufficiently kneading the components using a bead-mill, thereby preparing a heat dissipation adhesive composition. The prepared adhesive composition was coated onto a polyethylene terephthalate (PET) film subjected to release treatment using an applicator, followed by drying at 100° C. for 10 to 30 minutes, thereby preparing a 60 µm thick heat dissipation adhesive film.

Comparative Example 1

Preparation of Liquid Heat Dissipation Adhesive

A solvent (cyclohexanone) was added to a binder resin, an epoxy resin, a phenolic curing agent, a curing accelerator, thermally conductive particles, and a silane coupling agent in a composition as listed in Table 1 such that the solid content in the solution was 40% by weight, followed by sufficiently kneading the components using a bead-mill, thereby preparing a heat dissipation adhesive composition in a liquid phase.

Details of respective components used in the Examples and Comparative Examples are shown in Table 1.

TABLE 1

|  | Example 1 | Example 2 | Example 3 | Example 4 | Comparative Example 1 |
| --- | --- | --- | --- | --- | --- |
| Epoxy group containing acrylic polymer resin | 13 | 13 | 20 | 13 | 5 |
| Epoxy resin | 6.5 | 6.5 | 29 | 6.5 | 10.9 |
| Phenol novolac curing agent | 4.8 | 4.8 | 17.3 | 4.8 | 8.8 |
| Phosphine curing accelerator | 0.2 | 0.2 | 0.2 | 0.2 | 0.2 |
| Silane coupling agent | 0.5 | 0.5 | 0.5 | 0.5 | 0.1 |
| Spherical alumina | 75 |  |  | 65 | 75 |
| Aluminum nitride |  | 75 |  |  |  |
| Boron nitride |  |  | 33 | 10 |  |

A. Epoxy group containing acrylic polymer resin: SG-P3 (Nagase Chemtex Co., Ltd.)
B. Bifunctional liquid epoxy resin: YDF-170 (Kukdo Chemical Co., Ltd.)
C. Phenol novolac curing agent: DL-92 (Meiwa Plastic Industries Co., Ltd.)
D. Phosphine cuing accelerator: TPP-K (Meiwa Plastic Industries Co., Ltd.)
E. Silane coupling agent: KBM-303 (Shinetsu Co., Ltd.)
F. Spherical alumina: DAW-05 (Denka Co., Ltd.)
G. Aluminum nitride: AlN—H, (Tokuyama Co., Ltd.)
H. Boron nitride: PT-180 (Momentive Co., Ltd.)

Experimental Example

Property Evaluation of Heat Dissipation Adhesive Films of Examples and Liquid Compositions of Comparative Examples The properties of the heat dissipation adhesive films or liquid compositions prepared in Example 1 to 4 and Comparative Example 1 were evaluated, and results are shown in Table 2, below.

wafer chip using an EMC (SG-8500B) at 175° C. for 60 seconds such that an upper side of the wafer chip could be exposed, followed by forming a protective layer by post-curing at 175° C. for 2 hours. Detailed encasing conditions for the protective layer are shown in Table 3, below. Thereafter, the adhesive film was attached to the chip package by pressing the adhesive film on a hot plate at 120° C. for 1 second under a force of 1 kgf. Then, 1 cycle of curing was performed in an oven at 150° C. for 10 minutes and on a hot plate at 150° C. for 30 minutes, followed by curing at 175° C. for 60 minutes.

With the liquid adhesive prepared in Comparative Example 1, a specimen was prepared in the same manner as mentioned above except that 0.1 mg of the liquid adhesive was coated onto the chip package as mentioned above, and a 100 μm thick heat dissipation metal layer having a size of 20 mm×20 mm and composed of a copper-nickel double layer.

TABLE 3

| Mold temp. | Clamp pressure | Transfer pressure | Transfer time | Curing time |
| --- | --- | --- | --- | --- |
| 175° C. | 30 ton | 1.1 ton | 18 sec | 60 sec |

EMC tablet: EMC SG-8500BC (Cheil Industries Inc.)

Then, the resultant was divided into respective units using a singulation saw, followed by removal of PCB from the chip package and grinding using a grinder until each of the adhesive films of the Examples or the heat dissipation adhesive

TABLE 2

| Evaluation Item | Example 1 | Example 2 | Example 3 | Example 4 | Comparative Example 1 |
| --- | --- | --- | --- | --- | --- |
| Void area (%) | 5 | 4.5 | 5 | 6 | 20 |
| Adhesive strength 1 (between protective layer and heat dissipation adhesive layer) (kgf/25 mm$^2$) | 4.0 | 4.0 | 5.0 | 4.0 | 1.0 |
| Adhesive strength 2 (between heat dissipation metal layer and heat dissipation adhesive layer) (kgf/25 mm$^2$) | 6.0 | 5.0 | 6.0 | 4.0 | 1.7 |
| Adhesive strength 3 (between wafer chip and heat dissipation adhesive layer) (kgf/25 mm2) | 7.0 | 6.5 | 5.5 | 6.7 | 1.3 |
| Thermal conductivity (W/mK) | 1.2 | 1.3 | 1.1 | 1.5 | 0.6 |
| Moisture absorption reliability (Presence/Absence of cracks) | Absence | Absence | Absence | Absence | Presence |

1. Void Area (%):

After each of the adhesive films prepared in Examples 1 to 4 was mounted on a 100 μm thick heat dissipation metal layer having a size of 20 mm×20 mm and composed of a copper-nickel double layer, each of the adhesive films was attached to a chip package having a size of 10 mm×10 mm such that the adhesive film adjoined an upper surface of the chip package. At this time, the chip package was prepared by encasing a layer of Comparative Example 1 was exposed for measurement of the void proportion after encasing. After grinding, the presence of voids in the exposed adhesive film or the exposed adhesive layer was inspected using an SAT. To measure the number of voids, a lattice counting method was used. Specifically, the total area of the sample was divided into 10 lattice rows and 10 lattice columns, and the number of lattices including voids was counted and converted into % (void area ratio). A void area of 10% or less was determined as void removal, and a void area of 10% or more was determined as no void removal.

2. Adhesive strength 1 between heat dissipation adhesive layer and protective layer, Adhesive strength 2 between heat dissipation metal layer and heat dissipation adhesive layer, and Adhesive strength 3 between semiconductor element and heat dissipation adhesive layer After laminating each of the adhesive films prepared in Examples to a 530 µm thick wafer at 60° C., the wafer was cut into chips having a size of 5 mm×5 mm. The adhesive film attached to the wafer having a size of 5 mm×5 mm was attached to each of a protective layer having a size of 10 mm×10 mm, a wafer chip, a heat dissipation metal layer (copper-nickel double layer) on a hot plate at 120° C. for 1 second under a force of 1 kgf. Then, 1 cycle of curing was performed in an oven at 150° C. for 10 minutes and on a hot plate at 150° C. for 30 minutes, followed by curing at 175° C. for 60 minutes. The prepared specimen was subjected to moisture absorption under conditions of 85° C./85 RH % for 168 hours and reflow three times at a maximum temperature of 260° C., followed by measurement of die-shear strength at 250° C. using a DAGE 4000 tester.

For the liquid adhesive prepared in Comparative Example 1, die-shear strength was measured in the same manner as above except that 0.1 mg of the liquid adhesive of Comparative Example 1 was coated onto each of a protective layer having a size of 10 mm×10 mm, a wafer chip, a heat dissipation metal layer (copper-nickel double layer), and a wafer having a size of 5 mm×5 mm was placed thereon, followed by curing.

3. Thermal Conductivity

Each of the adhesive films prepared in the Examples was laminated to a size of 3 mm×3 mm×600 µm, followed by curing at 125° C. for 1 hour and at 175° C. for 2 hours. Thereafter, with each of the prepared samples placed between sensors for measurement of thermal conductivity, thermal conductivity was measured by applying predetermined heat thereto using a TCi tester (C-Therm Co., Ltd.).

In addition, the liquid adhesive prepared in Comparative Example 1 was coated to a thickness of 600 µm on a silicone-coated release film, followed by drying at 125° C. for 20 minutes to form a heat dissipation adhesive layer. Thereafter, the thermal conductivity was measured by the same method as mentioned above.

4. Moisture Absorption Reliability

After each of the adhesive films prepared in Examples 1 to 4 was mounted on a 100 µm thick heat dissipation metal layer having a size of 20 mm×20 mm and composed of a copper-nickel double layer, each of the adhesive films was attached to a chip package having a size of 10 mm×10 mm. Here, the chip package was prepared in the same manner as in measurement of void area. Thereafter, the adhesive film was attached to the chip package by pressing the adhesive film on a hot plate at 120° C. for 1 second under a force of 1 kgf, and subjected to 1 cycle of curing in an oven at 150° C. for 10 minutes and on a hot plate at 150° C. for 30 minutes, and curing at 175° C. for 60 minutes. The prepared specimen was subjected to moisture absorption under conditions of 85° C./85 RH % for 168 hours and reflow three times at a maximum temperature of 260° C., followed by observation of cracks.

By way of summation and review, liquid adhesives may be used as adhesives for a heat splitter or heat sink. Liquid adhesives may form a heat dissipation adhesive layer having a non-uniform thickness, thereby causing non-uniform heat transfer efficiency.

A heat dissipation adhesive film that provides improved workability and exhibits high thermal conductivity and suitable hardness while securing high heat transfer efficiency may be desirable.

The embodiments may provide a heat dissipation adhesive film capable of effectively dissipating heat from an electronic component and exhibiting improved properties in terms of thermal conductivity, flowability and workability.

The embodiments may provide a heat dissipation adhesive film, which has improved properties in terms of adhesion, void removal and moisture absorption reliability.

The embodiments may provide a semiconductor device capable of safely protecting semiconductor elements from heat, and a method of fabricating the same.

The heat dissipation adhesive film according to an embodiment may effectively dissipate heat from an electronic component, thereby securing excellent properties in terms of thermal conductivity, flowability and workability.

In addition, the heat dissipation adhesive film according to an embodiment may have a uniform thickness, thereby helping to secure uniform heat dissipation efficiency on the overall area of the film.

Further, the heat dissipation adhesive film according to the an embodiment may exhibit improved adhesion between the protective layer encasing a semiconductor element therein, the heat dissipation metal layer and/or the semiconductor element, thereby providing a highly reliable semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heat dissipation adhesive film comprising:
 a heat dissipation adhesive layer, the heat dissipation adhesive layer being placeable between a protective layer encasing a semiconductor element therein and a heat dissipation metal layer to bond the protective layer to the heat dissipation metal layer, wherein:
 an adhesive strength between the heat dissipation adhesive layer and the protective layer is about 3 kgf/25 mm$^2$ or greater,
 an adhesive strength between the heat dissipation adhesive layer and the heat dissipation metal layer is about 3 kgf/25 mm$^2$ or greater, and
 the heat dissipation adhesive layer is prepared from a composition that includes:
 about 5 wt % to about 35 wt % of a polymer resin,
 about 1 wt % to about 35 wt % of an epoxy resin, and
 about 20 wt % to about 85 wt % of thermally conductive particles, based on a total weight of the composition.

2. The heat dissipation adhesive film as claimed in claim 1, wherein the thermally conductive particles include at least one selected from the group of alumina, aluminum nitride, aluminum oxide, boron nitride, aluminum hydroxide, magnesium hydroxide, calcium carbide, magnesium carbide, calcium silicate, magnesium silicate, calcium oxide, magnesium oxide, titanium dioxide, and iron oxide particles.

3. The heat dissipation adhesive film as claimed in claim 1, wherein the heat dissipation adhesive layer further includes a base film.

4. The heat dissipation adhesive film as claimed in claim 1, wherein the thermally conductive particles are present in an amount of about 30 wt % to about 80 wt %, based on the total weight of the composition.

5. The heat dissipation adhesive film as claimed in claim 1, wherein the heat dissipation adhesive film has a thermal conductivity of 1 W/mK or greater.

6. The heat dissipation adhesive film as claimed in claim 1, wherein the polymer resin includes an epoxy group containing acrylic polymer resin.

7. The heat dissipation adhesive film as claimed in claim 1, wherein the thermally conductive particles include aluminum nitride or boron nitride.

8. A semiconductor device, comprising:
a semiconductor element;
a protective layer encasing the semiconductor element therein;
a heat dissipation adhesive layer on the protective layer; and
a heat dissipation metal layer on the heat dissipation adhesive layer,
wherein:
an adhesive strength between the heat dissipation adhesive layer and the protective layer is about 3 kgf/25 mm$^2$ or greater, and
an adhesive strength between the heat dissipation adhesive layer and the heat dissipation metal layer is about 3 kgf/25 mm$^2$ or greater, and
the heat dissipation adhesive layer is prepared from a composition that includes:
about 5 wt % to about 35 wt % of a polymer resin,
about 1 wt % to about 35 wt % of an epoxy resin, and
about 20 wt % to about 85 wt % of thermally conductive particles, based on a total weight of the composition.

9. The semiconductor device as claimed in claim 8, wherein:
the semiconductor element includes an exposed surface that is not encased by the protective layer, and
the heat dissipation adhesive layer contacts both the exposed surface and the protective layer.

10. The semiconductor device as claimed in claim 9, wherein the adhesive strength between the heat dissipation adhesive layer and the semiconductor element is about 3 kgf/25 mm$^2$ or greater.

11. The semiconductor device as claimed in claim 8, wherein the heat dissipation adhesive layer has a thermal conductivity of about 1 W/mK or greater.

12. The semiconductor device as claimed in claim 8, wherein the polymer resin includes an epoxy group containing acrylic polymer resin.

13. The semiconductor device as claimed in claim 8, wherein the thermally conductive particles include aluminum nitride or boron nitride.

14. A method of fabricating a semiconductor device, the method comprising:
forming a protective layer encasing a semiconductor element therein,
forming a heat dissipation adhesive layer and a heat dissipation metal layer on the protective layer, the heat dissipation adhesive layer having a thermal conductivity of about 1 W/mK or greater,
wherein forming the heat dissipation adhesive layer includes applying a composition, the composition including:
about 5 wt % to about 35 wt % of a polymer resin,
about 1 wt % to about 35 wt % of an epoxy resin, and
about 20 wt % to about 85 wt % of thermally conductive particles, based on a total weight of the composition.

15. The method as claimed in claim 14, wherein:
an adhesive strength between the heat dissipation adhesive layer and the protective layer is about 3 kgf/25 mm$^2$ or greater, and
an adhesive strength between the heat dissipation adhesive layer and the heat dissipation metal layer is about 3 kgf/25 mm$^2$ or greater.

16. The method as claimed in claim 14, wherein, in forming of the protective layer, the semiconductor element includes an exposed surface that is not encased by the protective layer, and the heat dissipation adhesive layer contacts both the exposed surface and the protective layer.

17. The method as claimed in claim 16, wherein an adhesive strength between the heat dissipation adhesive layer and the semiconductor element is about 3 kgf/25 mm$^2$ or greater.

18. The method as claimed in claim 14, wherein the forming the heat dissipation adhesive layer and the heat dissipation metal layer includes forming together a heat dissipation adhesive film on the protective layer, the heat dissipation adhesive film including a heat dissipation metal layer and a heat dissipation adhesive layer having a thermal conductivity of 1 W/mK or more.

19. The method as claimed in claim 14, wherein the polymer resin includes an epoxy group containing acrylic polymer resin.

20. The method as claimed in claim 14, wherein the thermally conductive particles include aluminum nitride or boron nitride.

* * * * *